United States Patent [19]

Sugiyama et al.

[11] Patent Number: 5,628,883

[45] Date of Patent: May 13, 1997

[54] METHOD FOR GENERATING AND ACTIVATING PLASMA PROCESS OF TREATMENT USING SAME, AND APPARATUS THEREFOR

[75] Inventors: Kazuo Sugiyama, Tokyo; Hiroaki Yamazaki; Yasuhiro Hirose, both of Ibaraki, all of Japan

[73] Assignee: Japan Vilene Co. Ltd., Tokyo, Japan

[21] Appl. No.: 194,401

[22] Filed: Feb. 10, 1994

Related U.S. Application Data

[63] Continuation-in-part of Ser. No. 898,441, Jun. 15, 1992, abandoned.

[30] Foreign Application Priority Data

| Jun. 18, 1991 | [JP] | Japan | 3-173113 |
| Sep. 5, 1991 | [JP] | Japan | 3-255700 |
| Nov. 20, 1991 | [JP] | Japan | 3-331392 |
| Jun. 15, 1992 | [JP] | Japan | 4-180308 |

[51] Int. Cl.⁶ .................. B44C 1/22; C03C 15/00
[52] U.S. Cl. .................. 204/192.32; 204/298.38; 427/508; 427/553; 427/575; 118/723 MW; 118/723 ME; 216/69; 438/729; 438/726; 156/345
[58] Field of Search .................. 204/192.38, 192.32, 204/298.38, 298.39; 156/345 P, 643.1, 646.1; 216/69; 118/723 MW, 723 ME, 723 MR, 723 MA, 723 AN; 427/508, 553, 575

[56] References Cited

U.S. PATENT DOCUMENTS

| 4,138,306 | 2/1979 | Nina | 204/298.38 X |
| 4,309,295 | 1/1982 | McSweeney | 501/136 X |
| 4,405,478 | 9/1983 | Murase et al. | 501/136 X |
| 4,547,314 | 10/1985 | Masuyama et al. | 501/136 X |
| 4,776,918 | 10/1988 | Otsubo et al. | 156/345 |
| 4,778,561 | 10/1988 | Ghanbari | 204/298.38 X |
| 5,013,401 | 5/1991 | Samukawa et al. | 156/643 |
| 5,024,716 | 6/1991 | Sato | 156/345 |
| 5,126,164 | 6/1992 | Okazaki et al. | 427/39 |

*Primary Examiner*—Nam Nguyen
*Attorney, Agent, or Firm*—Burgess, Ryan & Wayne

[57] ABSTRACT

A method for generating plasma, comprising irradiating an electromagnetic wave to an energy converter capable of converting an irradiated electromagnetic wave to an electric energy and discharging said electric energy, in the presence of a rare gas in a chamber. A method for activating plasma, further comprising applying an electric or magnetic field to said generated plasma, a process for treating a substrate, using the generated and optionally activated plasma, and apparatuses therefor are also disclosed.

32 Claims, 6 Drawing Sheets

METHOD FOR GENERATING AND ACTIVATING PLASMA PROCESS OF TREATMENT USING SAME, AND APPARATUS THEREFOR

RELATED APPLICATION

This application is a continuation-in-part of application Ser. No. 07/898,441 filed Jun. 15, 1992, now abandoned.

BACKGROUND OF THE INVENTION

1. Field of the Invention

The present invention relates to a method for generating plasma, a method for activating plasma, a process for treating a substrate using the plasma, and apparatuses therefor. According to the present invention, a plasma can be generated and also activated under atmospheric pressure, and further, used in treatment of a substrate.

2. Description of the Related Art

Treatment by low temperature plasma was hitherto known as a method for surface modification of polymeric materials or the like. However, such treatment by low temperature plasma requires vacuum condition of about $1 \times 10^{-5}$ to $1 \times 10^{-3}$ Torr. To satisfy such condition, not only is an expensive apparatus required but also complex treatment is necessary. In addition, most conventional treatment apparatuses using a low temperature plasma were equipped with electrodes, and had the disadvantage that the apparatuses could only treat materials sufficiently thinner than the distance between the electrodes.

To remedy the above disadvantages, Japanese Unexamined Published Patent Application (Kokai) No. 1-306569 and No. 2-15171 disclose methods for exciting a plasma under atmospheric pressure by using an electrode comprising a plurality of fine wires or an electrode with a solid dielectric material disposed therein. The methods made the apparatus and procedure therefor simpler in comparison with the prior art. However, the electrodes were used in the methods of Kokai 1-306,569 and 2-151171 as in the prior art, were limited to the treatment of materials thinner than the distance between the electrodes, and did not completely resolve the problems of the prior art.

SUMMARY OF THE INVENTION

The present inventors found that if a particular energy converter is used, plasma can be generated without an electrode, under atmospheric pressure, and the generated plasma can be activated by applying an electric and/or magnetic field to the plasma. Further, the present inventors found that surface modification of a material having an arbitrary thickness can be carried out by using the generated and optionally activated plasma.

Accordingly, an object of the present invention is to provide a novel method for generating plasma, using a particular energy converter, and not requiring electrodes. Another object is to provide a method for activating a substrate using such plasma and apparatuses therefor.

The present invention relates to a method for generating a plasma, comprising irradiating an energy converter, capable of converting irradiated electromagnetic waves to electric energy, with electromagnetic waves and discharging the electric energy, in the presence of a rare gas in a chamber.

The present invention also relates to a process for treating a substrate, comprising applying, to the substrate, a plasma generated by irradiating an energy converter capable of converting irradiated electromagnetic waves to electric energy with electromagnetic waves and discharging the electric energy, in the presence of a rare gas in a chamber.

Further, the present invention relates to a method for activating a plasma, comprising introducing a rare gas into a chamber, in a direction from an energy converter installed in the chamber and capable of converting irradiated electromagnetic waves to electric energy and discharging the electric energy, to a load installed in the chamber and capable of forming an electric or magnetic field;

irradiating the energy converter with electromagnetic waves; and applying an electric or magnetic field to the generated plasma.

Still further, the present invention relates to a process for treating a substrate, comprising applying, to the substrate, plasma activated by introducing a rare gas into a chamber, in a direction from an energy converter installed in the chamber and capable of converting irradiated electromagnetic waves to electric energy and discharging the electric energy, to a load installed in the chamber and capable of forming an electric or magnetic field; irradiating the energy converter with electromagnetic waves; and applying an electric or magnetic field to the generated plasma.

The present invention also relates to an apparatus for generating a plasma, comprising a chamber; an electromagnetic wave generator arranged to provide electromagnetic waves to the chamber; a gas inlet arranged to introduce a gas to the chamber; to contact an energy converter arranged in the chamber for receiving and converting irradiated electromagnetic waves to electric energy and discharging the electric energy.

Further, the present invention relates to an apparatus for treating a substrate with a plasma, comprising a chamber; an electromagnetic wave generator arranged to provide electromagnetic waves to the chamber; a gas inlet arranged to introduce a gas to the chamber to contact an energy converter arranged in the chamber for receiving and converting irradiated electromagnetic waves to electric energy and discharging the electric energy.

Still further, the present invention also relates to an apparatus for activating a plasma, comprising a chamber; an electromagnetic wave generator arranged to provide electromagnetic waves to the chamber; a gas inlet arranged to introduce a gas into the chamber; an energy converter arranged in the chamber for receiving and converting irradiated electromagnetic waves to electric energy and discharging the electric energy; and a load installed in the chamber, downstream of the energy converter in a path of a gas introduced from the gas inlet, the load capable of forming an electric or magnetic field.

Furthermore, the present invention also relates to an apparatus for treating a substrate by a plasma, comprising a chamber; an electromagnetic wave generator arranged to provide electromagnetic waves to the chamber; a gas inlet arranged to introduce a gas into the chamber; an energy converter arranged in the chamber for receiving and converting irradiated electromagnetic waves to electric energy and discharging the electric energy; a load arranged in the chamber at a point downstream of the energy converter in a path of a gas introduced through the gas inlet and capable of forming an electric or magnetic field.

BRIEF DESCRIPTION OF THE DRAWINGS

FIG. 2b is a sectional view taken along line C—C' of FIG. 2a.

FIG. 3b is a sectional view taken along line D—D' of FIG. 3a.

DESCRIPTION OF THE PREFERRED EMBODIMENTS

Figure 1:
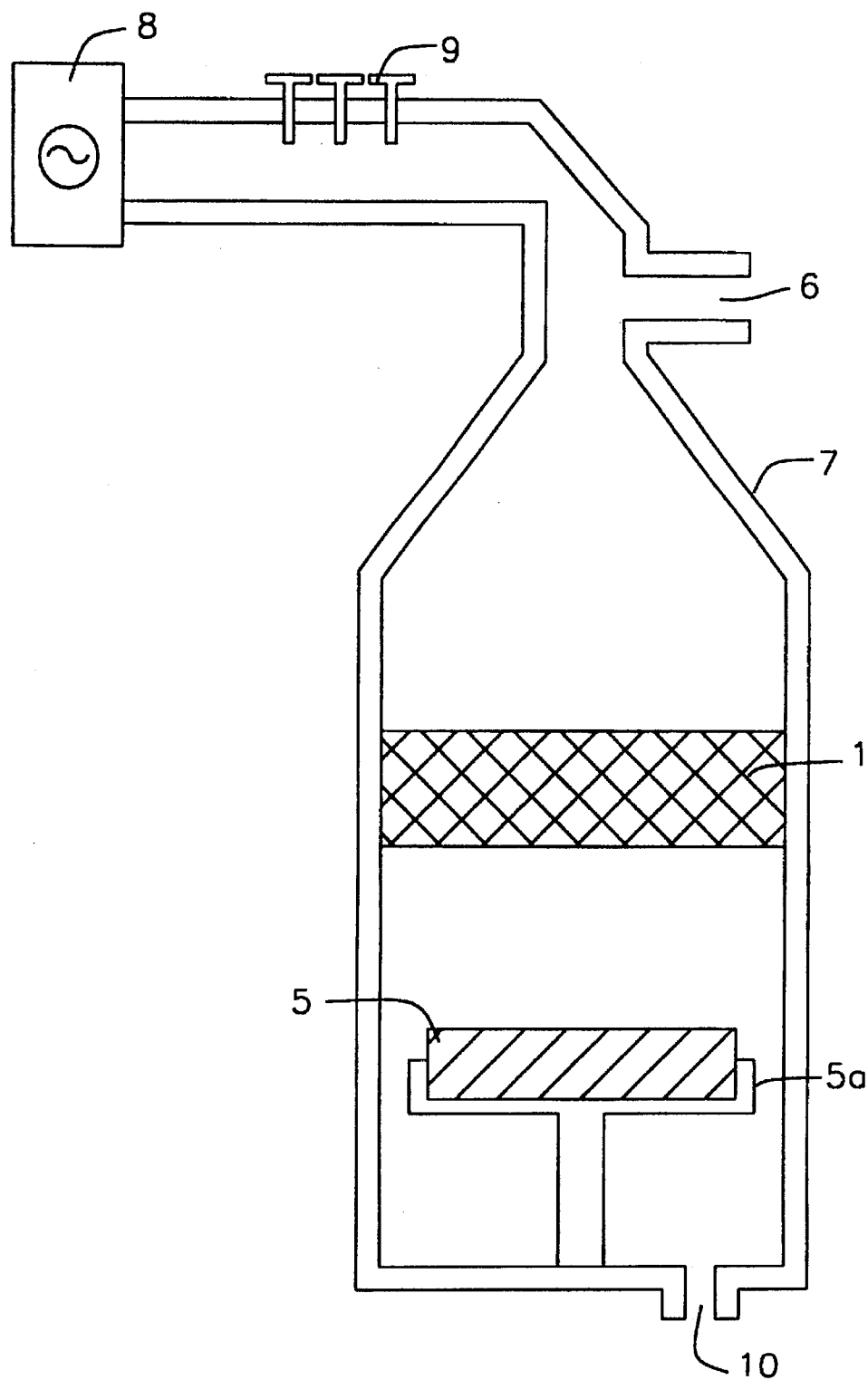
FIG. 1 is a sectional view schematically illustrating one form of an embodiment of an atmospheric plasma treatment apparatus according to the present invention.

The energy converter used in the present invention absorbs the energy of the electromagnetic waves with which it is irradiated, then discharges a plasma generating energy, i.e., an electric energy to excite the rare gas. The energy converter which may be used in the present invention is made of at least one material selected from the group consisting of a ceramic material and a carbonaceous material. The ceramic energy converter is preferably one which has defects in its crystal lattice and which is thus able to easily absorb and discharge the irradiated electromagnetic wave energy. As the examples of the ceramic material, there may be mentioned ceramics of oxides, carbides, nitrides, borides, silicides, and the like. More particularly, there may be mentioned ferrites of the general formula:

$$M'O.Fe_2O_3$$

wherein $M^I$ is a bivalent metal ion, such as $Mn^{2+}$, $Fe^{2+}$, $Co^{2+}$, $Ni^{2+}$, $Cu^{2+}$, or $Zn^{2+}$;

cements, such as magnesia cements of the general formula $$mM^{II}O.M^{II}Cl_2.nH_2O$$

wherein $M^{II}$ is a bivalent metal ion, such as, $Mg^{2+}$, or $Zn^{2+}$, m is an integer of 1 to 10, for example, 3, 5 or 8, and n is an integer of 5 to 20, for example, 15; glasses such as oxide glass, ceramics containing at least one component selected from the group consisting of $SiO_2$, $Al_2O_3$, $Na_2O$, $K_2O$, $Fe_2O_3$, $FeO$, $CaO$, $MgO$, $ZrO_2$, and $BeO$; superconductive substances, such as YBC (yttrium-barium-copper) oxides; and perovskite type oxide complexes of the general formula $$ABO_3$$

wherein A and B is a combination of monovalent and pentavalent metal ions, bivalent and quadravalent metal ions, or trivalent and trivalent metal ions, or B is a hexavalent metal ion and A is not existing, and A is $Na^+$, $K^+$, $Li^+$, $Rb^+$, $Ag^+$, $Ba^{2+}$, $Sr^{2+}$, $Cd^{2+}$, $Pb^{2+}$, $Ca^{2+}$, $La^{3+}$, $Y^{3+}$, $Sm^{3+}$, $Lu^{3+}$, $Gd^{3+}$, $Pr^{3+}$, $Nd^{3+}$, $Bi^{3+}$, $Ce^{4+}$, $Th^{4+}$, and B is $Mo^{6+}$, $W^{6+}$, $Re^{6+}$, $Ta^{5+}$, $Nb^{5+}$, $Ti^{4+}$, $Zr^{4+}$, $Sn^{4+}$, $Ce^{4+}$, $Cr^{4+}$, $Mn^{4+}$, $Hf^{4+}$, $V^{4+}$, $Mo^{4+}$, $Fe^{4+}$, $Ru^{4+}$, $Ir^{4+}$, $Pt^{4+}$, $Sc^{3+}$, $Ti^{3+}$, $Ru^{3+}$, $Rh^{3+}$, $Mn^{3+}$, $Cr^{3+}$, $Ni^{3+}$, $Co^{3+}$, $Y^{3+}$, $V^{3+}$, $Fe^{3+}$, $Mg^{3+}$, $Cu^{2+}$.

Among the above ceramic materials, perovskite type oxide complexes are preferred since they easily discharge the electric energy to generate a plasma.

Preferably a plasma is generated under atmospheric pressure, using perovskite oxide complexes of the general formula $$ABO_3$$

wherein A is $Na^+$, $K^+$, $Sr^{2+}$, $La^{3+}$ or $La^{3+}$ a part of which is substituted by $Sr^{2+}$, and B is $Nb^{5+}$, $Ti^{4+}$, $Mn^{3+}$, $Cr^{3+}$, $Ni^{3+}$ or $Co^{3+}$. Of the above perovskite oxide complexes, it is preferable to use $LaMnO_3$, $LaCrO_3$, $LaNiO_3$, $LaCoO_3$, $La_{0.8}Sr_{0.2}CoO_3$, $KNbO_3$, $La_{0.5}Sr_{0.5}CoO_3$, $SrTiO_3$, $La_{0.6}Sr_{0.4}CoO_3$, and $NaNbO_3$, because a plasma generated by such a perovskite oxide complex is stable under atmospheric pressure. $LaCoO_3$ is particularly preferable, because a plasma is easily generated under atmospheric pressure.

Further, perovskite type oxide complexes wherein some metal ions in the A sites and/or B sites are substituted by metal ions having different valences are more preferable because such oxide complexes have defects in the crystal lattice and easily discharge the electric energy to generate a plasma.

It is most preferable to use, as the energy converter, $La_xSr_{1-x}CoO_3$, (x is more than 0 and less than 1), i.e., a complex wherein a part of $La^{3+}$ in $LaCoO_3$ is substituted by $Sr^{2+}$, such as $La_{0.8}Sr_{0.2}CoO_3$, $La_{0.6}Sr_{0.4}CoO_3$, $La_{0.5}Sr_{0.5}CoO_3$, for efficiently treating as a substrate at atmospherical pressure.

An energy converter made of a carbonaceous material also absorbs the energy of the electromagnetic waves, and then discharges an electric energy to excite the rare gas under atmospheric pressure. It is considered that the energy can be easily discharged from the carbonaceous material because strain is produced in the layers in a layered structure of the carbonaceous material, which strain is caused by vibrations of the layers and/or defects in the layered structure.

As examples of the carbonaceous material, there may be mentioned gas carbon, amorphous carbon such as soot, charcoal, animal charcoal, and coke; graphite obtained by graphitization of substances containing carbon atoms or amorphous carbon; or activated carbon. It is preferred to use graphite as the carbonaceous material since a stable plasma can be easily generated under atmospheric pressure. It is preferred to cover the surface of the carbonaceous material with a compound having a high melting point, such as, iron, nickel, chrome, tungsten, stainless steel alloy, or titanium nitride, to minimize the loss of the carbonaceous material. The energy converter may be prepared from one of the above materials, or a combination of two or more above materials.

The energy converter may be installed at any position where irradiated electromagnetic waves can be received, namely, in a perpendicular direction or parallel direction with respect to the electromagnetic waves or in a certain angle with respect to the same. However, it is preferable to arrange the energy converter in a perpendicular direction with respect to the electromagnetic waves because the energy of the electromagnetic waves is easily absorbed and the electric energy is easily discharged.

Figure 2A:
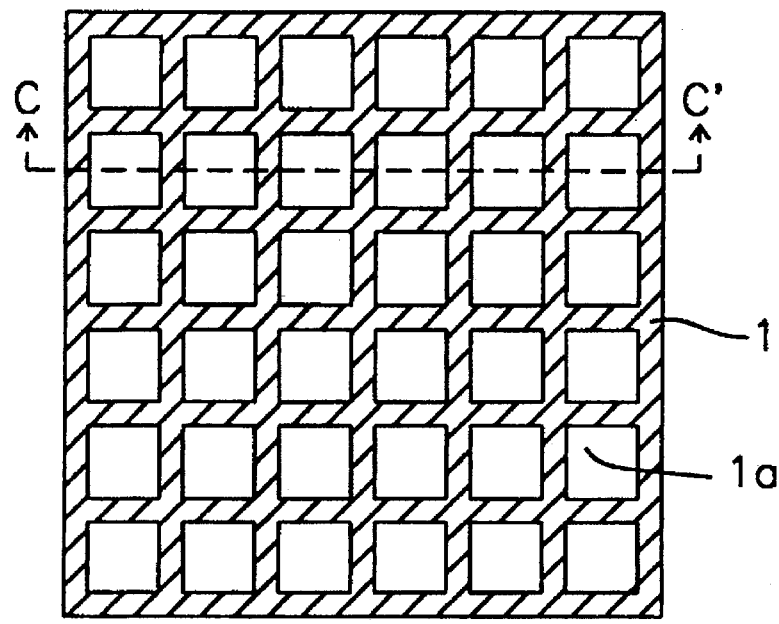
FIG. 2a is a plan view showing one form of an embodiment of an energy converter according to the present invention.
Figure 2B:
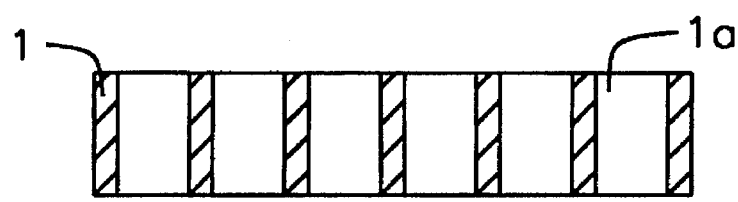
Figure 3A:
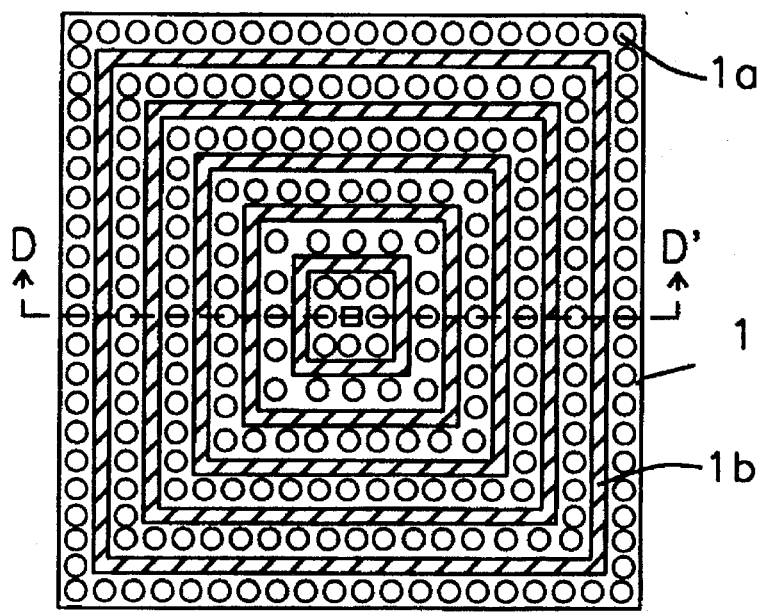
FIG. 3a is a plan view showing a different form of an embodiment of an energy converter according to the present invention.
Figure 3B:
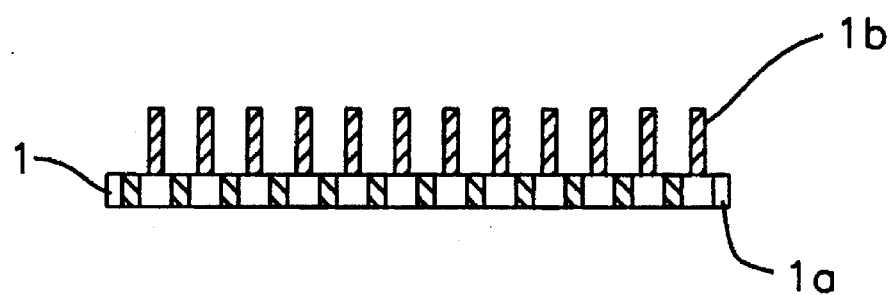

The energy converter may be formed as a lattice, as a structure carrying raised portions on the surface a honeycomb structure, or may be carried on a support such as a porous woven fabric, knitted fabric, nonwoven fabric or felt. Further, carbon fibers may be used to prepare the carbonaceous energy converter in the form of a porous woven fabric, knitted fabric, nonwoven fabric or felt. For example, the energy converter may be formed as shown in FIGS. 2 and 3. The energy converter 1 as shown in FIG. 2 is a lattice type containing spaces 1a. The energy converter 1 as shown in FIG. 3 has raised portions 1b and contains spaces 1a. The raised portions 1b may be sharp needles. If the above energy converters are used, excitation of the rare gas is easily obtained because the rare gas effectively receives the electric energy from the energy converters when passing through the honeycomb type converter or the like, the porous converter or the porous support. Further, if the above energy converters are used, plasma is generated at the opposite side of the energy converter, so it is possible to continuously treat the substrate without interfering with the irradiation of electromagnetic waves to the energy converter.

The rare gas used in the present invention is excited by the electric energy discharged from the energy converter to generate plasma. The rare gases which may be used are argon, helium, neon, or the like. Argon easily becomes a plasma and is preferable with respect to cost, and helium is easily converted to a continuous plasma state, and so argon and helium are preferably used. Further, argon is closer to air in specific gravity compared with helium and is easy to handle at atmospheric pressure, so is more suitable for use.

If the concentration of the rare gas is less than 50 percent, plasma is difficult to generate, so the concentration is preferably at least 50 percent, more preferably at least 90 percent.

When only the rare gas is introduced to generate a plasma in the present invention, it is possible to etch the surface of the substrate to be treated and improve the adhesion or the like. When ammonia, nitrogen, oxygen, or the like is introduced as a reactive gas in addition to the rare gas, it is possible to attach a functional group such as a hydroxyl, carbonyl, carboxyl or amino group to the surface of the substrate to be treated. When a saturated hydrocarbon compound such as methane or ethane, an unsaturated hydrocarbon compound such as ethylene or acrylonitrile, an aromatic compound such as benzene, an aliphatic hydrocarbon compound such as cyclohexane, or a fluorinated hydrocarbon compound such as ethylene tetrafluoride or ethylene hexafluoride is present in the rare gas, it is possible to render the substrate water-repellant, improve the adhesion, or the like.

When a reactive gas is mixed with the rare gas, the concentration of the reactive gas is preferably less than 50 percent, more preferably less than 10 percent. If the concentration of the reactive gas exceeds 50 percent, the concentration of the rare gas is reduced, and plasma is not generated, and then polymerization of the reactive gas does not occur.

The electromagnetic waves used in the present invention give the electromagnetic energy to the energy converter and are discharged as electric energy converted by the energy converter. A frequency of the electromagnetic waves is preferably several kilohertz (kHz) to several hundred gigahertz (GHz). It is preferable to use microwaves having a frequency of 1 to several tens of gigahertz (GHz), because such microwaves bring about sufficient electric energy discharged from the energy converter.

According to the present invention, plasma can be activated by applying an electric field and/or magnetic field to the plasma generated by the energy converter. A load which is connected with a source and can apply an electric field and/or magnetic field to plasma is arranged downstream from the energy converter in a path of the stream of the rare gas (or optionally in the form of a mixture with the reactive gas). Therefore, when the rare gas is introduced into a chamber including the energy converter and the load arranged downstream thereto under atmospheric pressure, electromagnetic waves are irradiated to the energy converter to generate plasma, and the generated plasma is activated by applying an electric field and/or magnetic field, the surface modification of the substrate to be treated is carried out more effectively. In particular, a substrate with a large width can be treated. Further, when the reactive gas is introduced in addition to the rare gas, the surface modification can also be carried out effectively.

The electric field and/or magnetic field may be applied in a perpendicular direction or parallel direction with respect to the gas (or plasma) stream or in a certain angle with respect to the same. It is preferable to apply the electric field and magnetic field, because the plasma can be more effectively activated.

The plasma generated and optionally activated under atmospheric pressure according to the present invention may be used for treating various substrate, as the plasma generated in the prior art. For example, the surface modification of various materials, such as a metal, an alloy, ceramic, glass, plastic, fibers, fabrics, film, and the like.

An embodiment of a plasma generating/treatment apparatus according to the present invention is schematically illustrated in FIG. 1. The plasma generating apparatus according to the present invention comprises an energy converter 1 installed in a chamber 7, i.e., housing 7 which contains at least an electromagnetic wave generator 8 and a gas inlet 6.

The housing 7 may have any shape and size so long as it can accommodate the energy converter 1 and electromagnetic waves can be irradiated on the energy converter 1, but it is preferable that the housing is covered with a protecting material such as aluminum which reflects electromagnetic waves.

The electromagnetic wave generator 8 structure is not limited as long as it can generate the electromagnetic waves having a frequency of several kilohertz (kHz) to several hundred gigahertz (GHz), and is, for example, a maser, a velocity modulation tube, a magnetron, a BK tube, or the like. The gas inlet 6 is not limited, and may be made of quartz glass. Further, the housing 7 may be optionally connected to a three-stub tuner 9 for adjusting the impedance, an isolator (not shown) for separating the reflected waves, a power monitor (not shown) for measuring the intensity of the electromagnetic waves, a gas outlet 10 for discharging the rare gas and unreacted reactive gas, or a circulation apparatus (not shown) for recycling the rare gas or unreacted reactive gas. Further, in the plasma treatment apparatus according to the present invention, a substrate mount 5a may be arranged downstream of the energy converter 1, and the substrate 5 can be put on the mount 5a to carry out the surface treatment. In the plasma generating/treatment apparatus according to the present invention, an airtight sealing means is not necessary.

Figure 4:
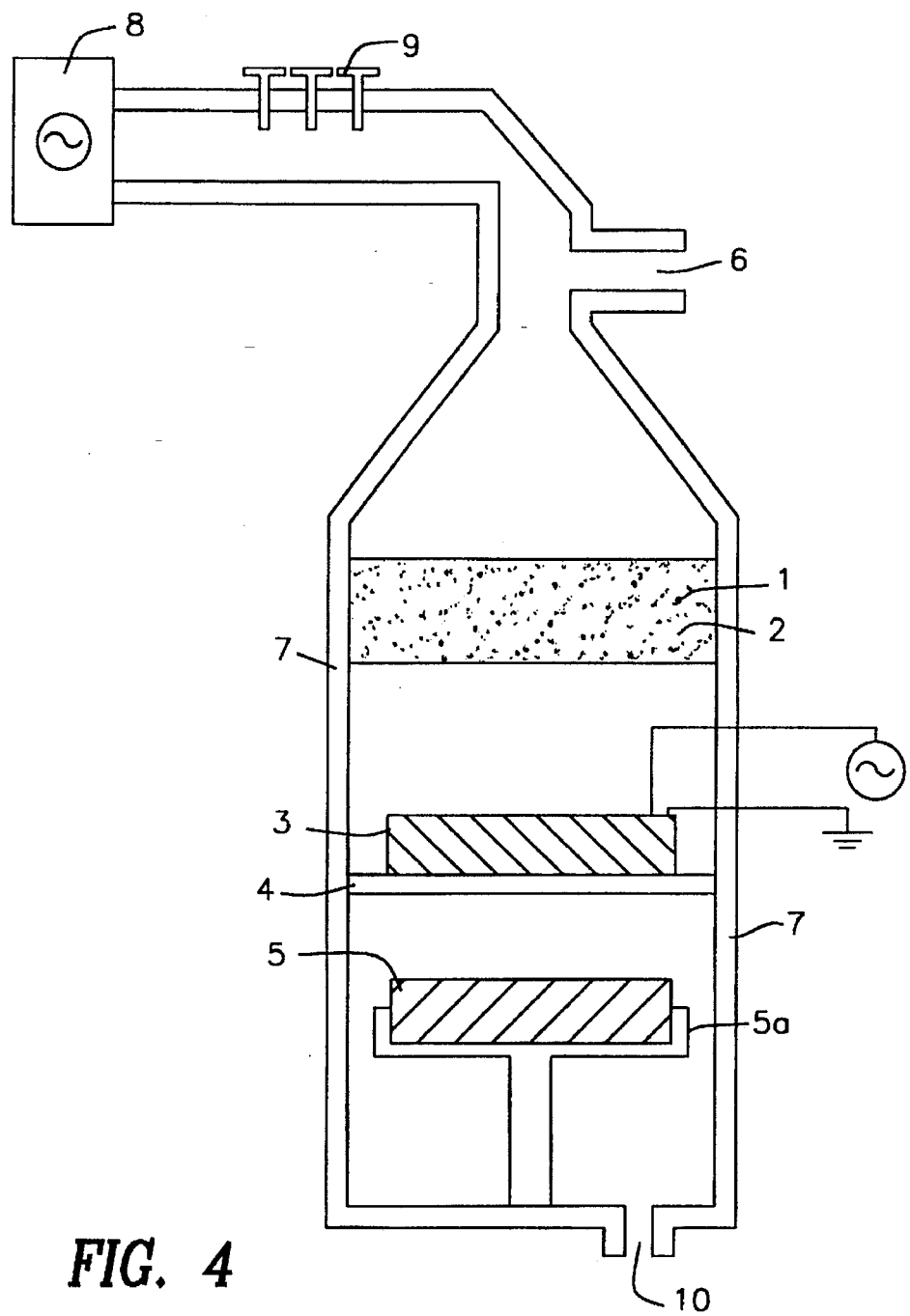
FIG. 4 is a sectional view schematically illustrating one form of an embodiment of an apparatus for activating atmospheric plasma according to the present invention.
Figure 5:
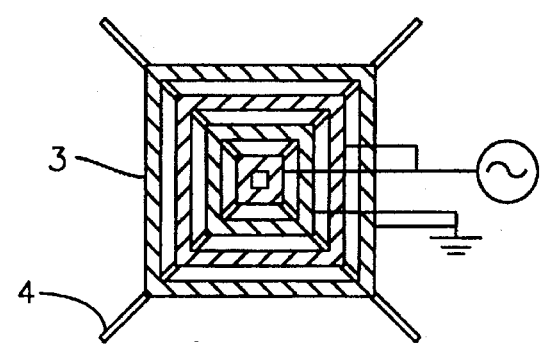
FIG. 5 is a sectional view of a load installed in the apparatus of FIG. 4.

An embodiment of an apparatus for activating plasma according to the present invention is schematically illustrated in FIGS. 4 and 5. The atmospheric plasma activating apparatus according to the present invention further comprises a load 3 connected to a source and arranged downstream (with respect to the gas stream) to the energy converter 1, in the atmospheric plasma generating/treating apparatus shown in FIG. 1. The atmospheric plasma activating apparatus shown in FIG. 4 includes the energy converter 1 carried on a support 2. In FIG. 4, means corresponding to those in FIG. 1 are shown by the same reference numbers.

Figure 6:
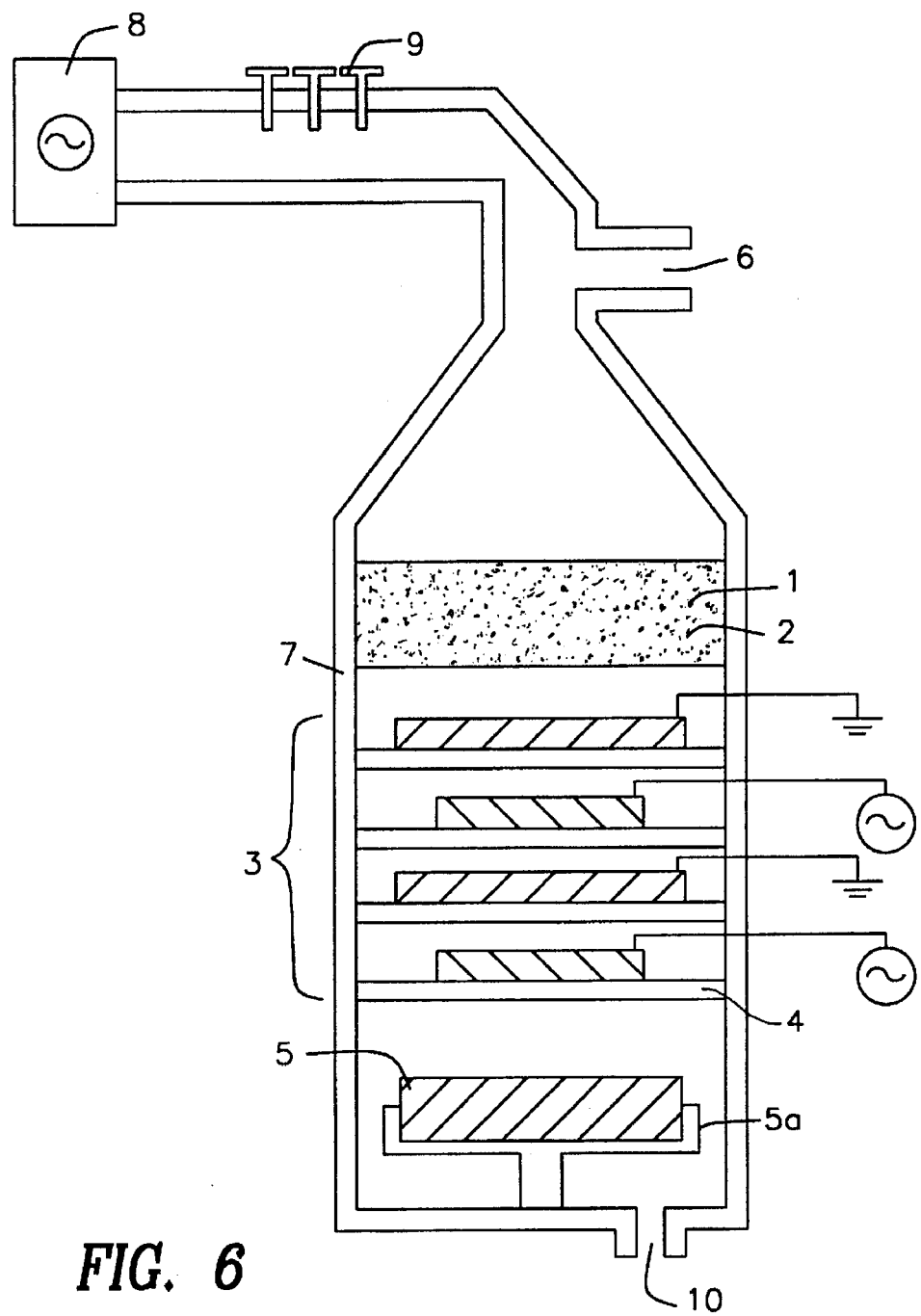
FIG. 6 is a sectional view schematically illustrating another form of an embodiment of an apparatus for activating atmospheric plasma according to the present invention.
Figure 7:
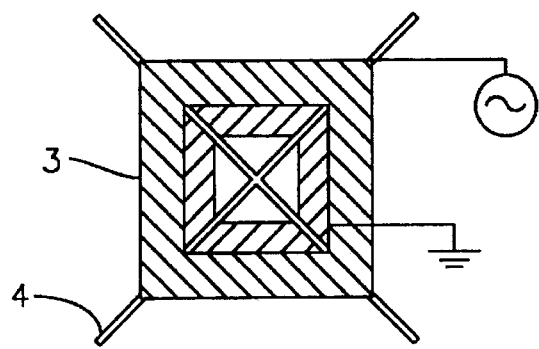
FIG. 7 is a sectional view of a load installed in the apparatus of FIG. 6.
Figures 8, 9:
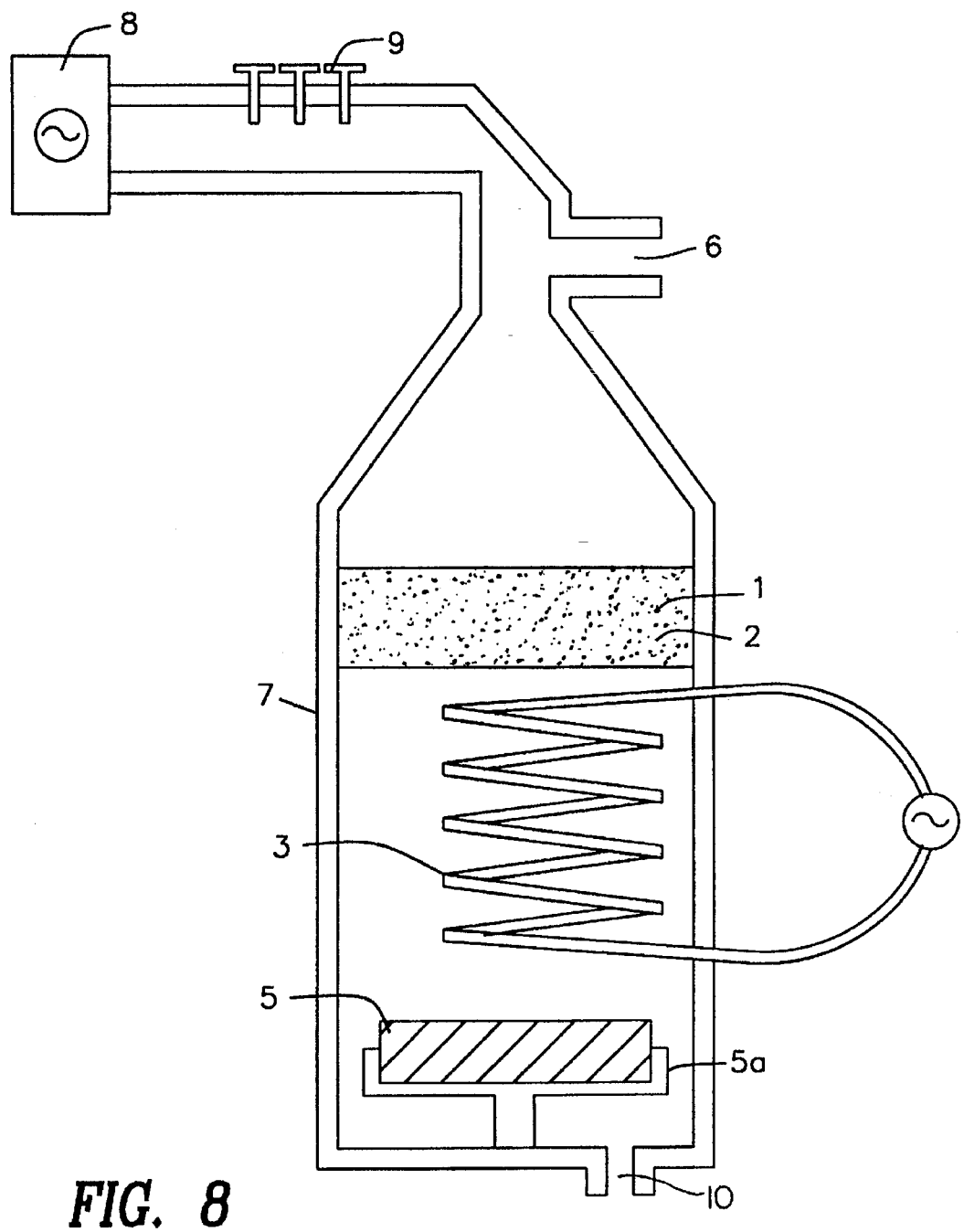
FIG. 8 is a sectional view schematically illustrating still another form of an embodiment of an apparatus for activating atmospheric plasma according to the present invention.
FIG. 9 is a sectional view of a load installed in the apparatus of FIG. 8.

In the plasma activating apparatus shown in FIGS. 4 and 5, the electrodes are arranged in parallel with the gas stream. However, the electrodes may be arranged perpendicularly to the gas stream as shown in FIGS. 6 and 7. Further, the sizes of the adjacent upper and lower electrodes may be changed to effectively apply the electric and/or magnetic field to the plasma. As shown in FIGS. 8 and 9, a coil may be arranged as the load 3. It is sufficient if the load 3 is arranged so as not to interfere with the treatment of the substrate 5 by the plasma. Further, the load 3 may be arranged outside the housing 7.

When generating an electric field and/or magnetic field by electrodes arranged in the housing 7 as shown in FIGS. 4 to 7, if the distance between the electrodes and the housing 7 is less than the distance between the respective electrodes, an electric field and/or magnetic field is produced between the electrodes and the housing 7, so it is preferable to make the distance between the electrodes and the housing 7 larger than that between the respective electrodes. Therefore, it is preferable to put the electrodes on a carrier 4 made of an insulator.

According to the present invention, as explained above, a plasma can be generated by irradiating the energy converter 1 installed in the housing 7 with electromagnetic waves to thereby discharge the electric energy from the energy converter 1 and excite the rare gas introduced into the housing 7. If the surface modification of the substrate 5 is carried out using such plasma, the thickness of the substrate 5 is not limited because no electrodes are used. Further, because the modification can be carried out under atmospheric pressure and a vacuum state is not necessary, there is no need for a large and expensive apparatus, or complicated procedures. By activating the generated plasma by applying an electric and/or magnetic field, substrate 5 may be more effectively treated as well as a wide substrate.

EXAMPLES

The present invention now will be further illustrated by, but by no means limited to, the following Examples. In the Examples, the contact angle is obtained by measurement under conditions of a temperature of 20° C. and a humidity of 65 percent using a contact angle measurement apparatus (CA-DS made by Kyowa Kagaku K.K.) 30 seconds after dropping ion exchange water on the substrate 5. Further, the thickness of the film formed on the substrate surface was measured by an electron microscope.

Examples 1 to 6, and Comparative Example

An apparatus as schematically shown in FIG. 1 was used, except that the energy converter 1 was put on support 2. One gram of various types of energy converters of 20 to 60 mesh as listed in Table 1 was carried by sintering onto the support 2 made of cordierite and was arranged in an aluminum housing 7 connected to a magnetron as an electromagnetic wave generator 8. Further, polyethyleneterephthalate film (PET film) was disposed in the housing 7 as substrate 5. The distance between the PET film and the energy converter 1 was 5 cm.

Argon gas (100%) was introduced from the gas inlet 6 at a flow rate of 200 ml/min and microwaves having a frequency of 2.45 GHz were irradiated from the magnetron of an output of 60 W to the various energy converters 1 to generate plasma, which was used to treat PET film (contact angle 78°) for 5 minutes. Thereafter, the contact angle of the treated PET film was measured. The results are shown in Table 1. Further, as a comparative example, the same procedure was repeated except that no energy converter 1 was used, then the contact angle was measured. The results are also shown in Table 1.

TABLE 1

| Example | Energy converter | State of plasma | Contact angle |
| --- | --- | --- | --- |
| 1 | $LaMnO_3$ | Difficult to generate, but stable | 76° |
| 2 | $LaCrO_3$ | Difficult to generate, but stable | 75° |
| 3 | $LaNiO_3$ | Difficult to generate, but stable | 76° |
| 4 | $LaCoO_3$ | Easy to generate and stable | 69° |
| 5 | $La_{0.8}Sr_{0.2}CoO_3$ | Easy to generate and stable | 70° |
| 6 | Activated carbon | Easy to generate but unstable | 72° |
| Comparative Example | None | Not generated | 78° |

Examples 7 to 10

The same procedure was repeated as in Examples 1 to 6 to perform the plasma treatment, except that the various types of energy converters 1 shown in Table 2 were used, and the flow rate of argon was 190 ml/min and that of oxygen was 10 ml/min. Thereafter, the contact angle of the PET film treated was measured. The results are shown in Table 2.

TABLE 2

| Example | Energy converter | State of plasma | Contact angle |
| --- | --- | --- | --- |
| 7 | $KNbO_3$ | Difficult to generate, but stable | 75° |
| 8 | $LaCoO_3$ | Easy to generate, and stable | 71° |
| 9 | $La_{0.5}Sr_{0.5}CoO_3$ | Easy to generate and stable | 68° |
| 10 | Activated carbon | Easy to generate, but unstable | 72° |

Examples 11 to 14

The same procedure was repeated as in Examples 1 to 6 to perform the plasma treatment, except that the various types of energy converters 1 shown in Table 3 were used. A mixture of argon (280 ml/min) and carbon tetrafluoride (20 ml/min) was used, the output of the magnetron was 100 W, microwaves of a frequency of 2.45 GHz were irradiated, and the treatment was performed for one hour. Thereafter, the contact angle of the PET film and the thickness of the polytetrafluoroethylene and polytetrafluoroethylene-like film formed on the surface of the PET film were measured. The results are shown in Table 3

TABLE 3

| Example | Energy converter | Film thickness | Contact angle |
|---|---|---|---|
| 11 | $SrTiO_3$ | 15 μm | 99° |
| 12 | $LaCoO_3$ | 41 μm | 99° |
| 13 | $La_{0.6}Sr_{0.4}CoO_3$ | 48 μm | 99° |
| 14 | Activated carbon | 32 μm | 99° |

Examples 15 to 18

The same procedure was repeated as in Examples 11 to 14 to perform the plasma treatment, except that the various types of energy converters 1 shown in Table 4 were used. A mixture of argon (280 ml/min) and methane (20 ml/min) was used, and polytetrafluoroethylene film (PTFE film) was used as a substrate 3. Thereafter, the thickness of the polyethylene and polyethylene-like film formed on the surface of the PTFE film was measured. The results are shown in Table 4.

TABLE 4

| Example | Energy converter | Film thickness |
|---|---|---|
| 15 | $NaNbO_3$ | 18 μm |
| 16 | $LaCoO_3$ | 49 μm |
| 17 | $La_{0.8}Sr_{0.2}CoO_3$ | 57 μm |
| 18 | Activated carbon | 37 μm |

Examples 19 to 24

An apparatus as schematically shown in FIG. 4 was used. An energy converter 1 carried on the support 2 made of cordierite by sintering 1 g of $La_{0.8}Sr_{0.2}CoO_3$ of 20 to 60 mesh thereto was arranged in an aluminum housing 7 having a widest lateral sectional face of 30 cm×30 cm and connected to a magnetron. Under the energy converter 1, electrodes spaced 10 mm apart and connected to a power source were put as the load 3 on a ceramic carrier 4 and were arranged in parallel to the rare gas flow. Further, under the electrodes, PET film was disposed as the substrate 5 in the housing 7.

Argon gas (100%) was introduced from the gas inlet 6 at a flow rate of 150 ml/min and microwaves having a frequency of 2.45 GHz were irradiated from the magnetron of various outputs listed in Table 5 to the energy converter 1 to generate plasma, and then various electromagnetic fields were formed by the load 3 to activate plasma, which then was used to treat the PET film (contact angle 78°) for 5 minutes. Thereafter, the contact angle of the treated PET film was measured. The results are shown in Table 5.

TABLE 5

| | Microwave | Load | | |
|---|---|---|---|---|
| Example | output (W) | source | power | Contact angle |
| 19 | 150 | 13.56 MHz | 50 W | 68° |
| 20 | 150 | 500 MHz | 50 W | 71° |
| 21 | 150 | 3 MHz | 50 W | 74° |
| 22 | 300 | 13.56 MHz | 40 W | 67° |
| 23 | 300 | 500 MHz | 40 W | 70° |
| 24 | 300 | 3 MHz | 45 W | 74° |
| 25 | 400 | — | — | 78° |

[— means no load.]

Example 25

The same procedure was repeated as in Examples 19 to 24 to treat the PET film, except that load 3 was not disposed and the output of the microwaves was 400 W, then the contact angle of the treated PET film was measured. The result is also shown in the above Table 5.

Examples 26 to 31

An apparatus as schematically shown in FIG. 8 was used. The same procedure was repeated as in Examples 19 to 24 to treat the PET film and measure the contact angle of the treated PET film, except that a six-turn coil having a diameter of 15 cm and connected to a power source was disposed as the load 3 under the energy converter 1, various types of microwaves as listed in Table 6 were irradiated, and various magnetic fields were formed by the load 3. The results are shown in Table 6.

TABLE 6

| | Microwave | Load | | |
|---|---|---|---|---|
| Example | output (W) | source | power | Contact angle |
| 26 | 150 | 13.56 MHz | 50 W | 77° |
| 27 | 150 | 500 MHz | 50 W | 77° |
| 28 | 150 | 3 MHz | 50 W | 77° |
| 29 | 300 | 13.56 MHz | 40 W | 77° |
| 30 | 300 | 500 MHz | 40 W | 77° |
| 31 | 300 | 3 MHz | 45 W | 77° |

Examples 32 to 37

The same procedure was repeated as in Examples 19 to 24 to perform the plasma treatment, except that the various types of energy converters 1 shown in Table 7 were used, a mixture of argon (450 ml/min) and carbon tetrafluoride (50 ml/min) was used, the output of the magnetron was 300 W, microwaves of a frequency of 2.45 GHz were irradiated, and various outputs of the load 3 shown in Table 7 were used. Thereafter, the contact angle of the PET film and the thickness of the polytetrafluoroethylene and polytetrafluoroethylene-like film formed on the surface of the PET film were measured. The results are shown in Table 7.

TABLE 7

| Example | Energy converter | Load | | Film thickness | Contact angle |
|---|---|---|---|---|---|
| | | source | power | | |
| 32 | $La_{0.8}Sr_{0.2}CoO_3$ | 13.56 MHz | 70 W | 50 μm | 99° |
| 33 | $La_{0.8}Sr_{0.2}CoO_3$ | 500 MHz | 80 W | 48 μm | 99° |
| 34 | $La_{0.8}Sr_{0.2}CoO_3$ | 3 MHz | 100 W | 51 μm | 99° |
| 35 | $La_{0.5}Sr_{0.5}CoO_3$ | 13.56 MHz | 70 W | 47 μm | 99° |
| 36 | $LaCoO_3$ | 13.56 MHz | 70 W | 40 μm | 99° |
| 37 | Activated carbon | 13.56 MHz | 70 W | 31 μm | 99° |

Example 38

An apparatus as schematically shown in FIG. 1 was used. A honeycomb-shaped graphitized article made from pitch coke as shown in FIG. 2 was arranged in an aluminum housing 7 connected to a magnetron. Further, PET film was disposed in the housing 7 as the substrate 5.

Argon gas (100%) was introduced from the gas inlet 6 at a flow rate of 200 ml/min and microwaves having a frequency of 2.45 GHz were irradiated from the magnetron of an output of 60 W to the carbonaceous energy converter 1 to generate plasma, which then was used to treat PET film (contact angle 78°) for 5 minutes. Thereafter, the contact angle of the treated PET film was measured and found to be 68°.

Example 39

The same carbonaceous material 1 as in Example 38 was used, and the same procedure was repeated as in Example 38 to perform plasma treatment except that a mixture of argon (190 ml/min) and oxygen (10 ml/min) was used. The contact angle of the treated PET film was measured and found to be 67°.

Example 40

The same carbonaceous material 1 as in Example 38 was used, and the same procedure was repeated as in Example 38 to perform plasma treatment except that a mixture of argon (280 ml/min) and carbon tetrafluoride (20 ml/min) was used. The output of the magnetron was 100 W, microwaves having a frequency of 2.45 GHz were irradiated, and the treatment was carried out for one hour. The contact angle of the treated PET film was 99° and the thickness of the polytetrafluoroethylene and polytetrafluoroethylene-like film formed on the surface of the PET film was 50 µm.

Example 41

The same carbonaceous material 1 as in Example 38 was used, and the same procedure was repeated as in Example 40 to perform plasma treatment except that a mixture of argon (280 ml/min) and methane (20 ml/min) was used, and PTFE film was used as the substrate 5. The thickness of the polyethylene and polyethylene-like film formed on the surface of the PTFE film was 59 µm.

Examples 42 to 47

An apparatus as schematically shown in FIG. 4 was used, except that a honeycomb-shaped graphitized article made from pitch coke as shown in FIG. 5 was used as the energy converter 1 and the support 2 was not used. The honeycomb-shaped graphitized article was arranged in an aluminum housing 7 connected to a magnetron. Downstream to the carbonaceous material 1, electrodes spaced 10 mm apart and connected to a power source were put as the load 3 on a ceramic carrier 4 and arranged in parallel to the rare gas flow. Further, a PET film was arranged in the housing 7 downstream of the electrodes as the substrate 5.

Argon gas (100%) was introduced from the gas inlet 6 at a flow rate of 150 ml/min and microwaves having a frequency of 2.45 GHz were irradiated from the magnetron of various outputs as listed in Table 8 to the carbonaceous energy converter 1 to generate plasma. Various electromagnetic fields as listed in Table 8 were formed by the load 3 to activate plasma, and then the PET film was treated for 5 minutes. Thereafter, the contact angle of the PET film treated was measured. The results are shown in Table 8.

TABLE 8

| Example | Microwave output (W) | Load source | Load power | Contact angle |
|---|---|---|---|---|
| 42 | 150 | 13.56 MHz | 50 W | 66° |
| 43 | 150 | 500 MHz | 50 W | 70° |
| 44 | 150 | 3 MHz | 50 W | 74° |
| 45 | 300 | 13.56 MHz | 40 W | 65° |

TABLE 8-continued

| Example | Microwave output (W) | Load source | Load power | Contact angle |
|---|---|---|---|---|
| 46 | 300 | 500 MHz | 40 W | 69° |
| 47 | 300 | 3 MHz | 45 W | 74° |

Examples 48 to 53

An apparatus as schematically shown in FIG. 8 was used, except that a honeycomb-shaped graphitized article made from pitch coke as shown in FIG. 5 was used as the energy converter 1 and the support 2 was not used. The same procedure was repeated as in Examples 42 to 47 to treat the PET film and measure the contact angle of the treated PET film, except that a six-turn coil having a diameter of 15 cm and connected to a power source as shown in FIGS. 8 and 9 was disposed as the load 3 downstream to the carbonaceous material 1. Various outputs as listed in Table 9 of microwaves were irradiated, and various magnetic fields as listed in Table 9 were formed by the load 3. The results are shown in Table 9.

TABLE 9

| Example | Microwave output (W) | Load source | Load power | Contact angle |
|---|---|---|---|---|
| 48 | 150 | 13.56 MHz | 50 W | 76° |
| 49 | 150 | 500 MHz | 50 W | 76° |
| 50 | 150 | 3 MHz | 50 W | 76° |
| 51 | 300 | 13.56 MHz | 40 W | 76° |
| 52 | 300 | 500 MHz | 40 W | 76° |
| 53 | 300 | 3 MHz | 45 W | 76° |

According to the present invention, plasma can be generated under atmospheric pressure, so the plasma treatment apparatus becomes inexpensive and the workability is superior. If a ceramic (in particular a perovskite type oxide complex) or carbonaceous material is used as the energy converter, plasma is easily generated. Further, the surface modification of the substrate having various shapes and thickness can be performed, because it is not necessary to pass the substrate between the electrodes as in the prior art.

Further, if rare gas is introduced to generate plasma and treat a substrate, it is possible to etch the substrate surface, while if a rare gas and reactive gas are introduced to generate plasma and treat the substrate, it is also possible to perform cross-linking, chemically modifying, graft polymerizing or coating on the surface layer of the substrate. Furthermore, if plasma is activated by applying an electric field and/or magnetic field formed by a load arranged downstream to the energy converter in the gas flow, etching, cross-linking, chemically modifying, graft polymerizing or coating may be more effectively carried out.

Although the present invention has been described with reference to specific embodiments, various changes and modifications obvious to those skilled in the art are deemed to be within the spirit, scope and concept of the invention.

What is claimed is:

1. A method for generating plasma which comprises:
   irradiating with electromagnetic waves an energy converter capable of converting electromagnetic waves to electric energy and discharging said electric energy, under atmospheric pressure, in the presence of a rare gas in a plasma generating zone; and supplying a composition comprising the rare gas to the same side of the converter to which the electromagnetic waves are irradiated; wherein said energy converter comprises a material selected from the group consisting of
(1) a carbonaceous material selected from the group consisting of amorphous carbon, graphite and activated carbon and
(2) a perovskite oxide complex of the formula $ABO_3$ wherein A is selected from the group consisting of $Na^+$, $K^+$, $Sr^{2+}$, $La^{3+}$, and $La^{3+}$ a part of which is substituted by $Sr^{2+}$ and B is selected from the group consisting of $Nb^{5+}$, $Ti^{4+}$, $Mn^{3+}$, $Cr^{3+}$, $Ni^{3+}$ and $Co^{3+}$.

2. A method according to claim 1, wherein a surface of said carbonaceous material is covered with a high melting point material selected from the group consisting of iron, nickel, chrome, tungsten, stainless steel alloy and titanium nitride.

3. A method according to claim 1, wherein said perovskite oxide complex is selected from the group consisting of $LaMnO_3$, $LaCrO_3$, $LaNiO_3$, $LaCoO_3$, $La_{0.8}Sr_{0.2}CoO_3$, $KNbO_3$, $La_{0.5}Sr_{0.5}CoO_3$, $SrTiO_3$, $La_{0.6}Sr_{0.4}CoO_3$, and $NaNbO_3$.

4. A method according to claim 3 wherein said perovskite oxide complex is selected from the group consisting of $La_{0.8}Sr_{0.2}CoO_3$, $La_{0.6}Sr_{0.4}CoO_3$, and $La_{0.5}Sr_{0.5}CoO_3$.

5. A method for treating a substrate under atmospheric pressure, comprising:
applying to said substrate, a plasma generated by irradiating with electromagnetic waves an energy converter capable of converting electromagnetic waves to electric energy and discharging said electric energy, in the presence of a composition comprising a rare gas; supplying a composition comprising the rare gas to the same side of the converter to which the electromagnetic waves are irradiated; passing the gas through the converter and any support therefor; and withdrawing a plasma from the opposite side of the converter whereby the plasma is applied to the substrate; and wherein said energy converter comprises a material selected from the group consisting of:
(1) a carbonaceous material selected from the group consisting of amorphous carbon, graphite and activated carbon and
(2) a perovskite oxide complex of the general formula $ABO_3$ wherein A is selected from the group consisting of $Na^+$, $K^+$, $Sr^{2+}$, $La^{3+}$, and $La^{3+}$ a part of which is substituted by $Sr^{2+}$, and B is selected from the group consisting of $Nb^{5+}$, $Ti^{4+}$, $Mn^{3+}$, $Cr^{3+}$, $Ni^{3+}$ and $Co^{3+}$.

6. A method according to claim 5, wherein a surface of said carbonaceous material is covered with a high melting point material selected from the group consisting of iron, nickel, chrome, tungsten, stainless steel alloy and titanium nitride.

7. A method according to claim 5, wherein said perovskite oxide complex is selected from the group consisting of $LaMnO_3$, $LaCrO_3$, $LaNiO_3$, $LaCoO_3$, $La_{0.8}Sr_{0.2}CoO_3$, $KNbO_3$, $La_{0.5}Sr_{0.5}CoO_3$, $SrTiO_3$, $La_{0.6}Sr_{0.4}CoO_3$, and $NaNbO_3$.

8. A method according to claim 7, wherein said perovskite oxide complex is selected from the group consisting of $La_{0.8}Sr_{0.2}CoO_3$, $La_{0.6}Sr_{0.4}CoO_3$, and $La_{0.5}Sr_{0.5}CoO_3$.

9. A method for activating a plasma under atmospheric pressure comprising:
passing a composition comprising a rare gas into a chamber in a direction through an energy converter arranged in said chamber and capable of converting electromagnetic waves to electric energy and discharging said electric energy to a load arranged in said chamber and capable of forming an electric or magnetic field; the composition comprising the rare gas being passed to the same side of the converter to which the electromagnetic waves are irradiated, irradiating the electromagnetic waves to generate a plasma; and applying an electric or magnetic field to said generated plasma; wherein said energy converter comprises a material selected from the group consisting of:
(1) a carbonaceous material selected from the group consisting of amorphous carbon, graphite and activated carbon and
(2) perovskite oxide complex of the formula $ABO_3$ wherein A is selected from the group consisting of $Na^+$ K, $Sr^{2+}$, $La^{3+}$, and $La^{3+}$ a part of which is substituted by $Sr^{2+}$, and B is selected from the group consisting of $Nb^{5+}$, $Ti^{4+}$, $Mn^{3+}$, $Cr^{3+}$, $Ni^{3+}$ and $Co^{3+}$.

10. A method according to claim 9, wherein a surface of said carbonaceous material is covered with a high melting point material selected from the group consisting of iron, nickel, chrome, tungsten, stainless steel alloy and titanium nitride.

11. A method according to claim 9, wherein said perovskite oxide complex is selected from the group consisting of $LaMnO_3$, $LaCrO_3$, $LaNiO_3$, $LaCoO_3$, $La_{0.8}Sr_{0.2}CoO_3$, $KNbO_3$, $La_{0.5}Sr_{0.5}CoO_3$, $SrTiO_3$, $La_{0.6}Sr_{0.4}CoO_3$, and $NaNbO_3$.

12. A method according to claim 11, wherein said perovskite oxide complex is selected from the group consisting of $La_{0.8}Sr_{0.2}CoO_3$, $La_{0.6}Sr_{0.4}CoO_3$ and $La_{0.5}Sr_{0.5}CoO_3$.

13. A process for treating a substrate under atmospheric pressure comprising:
applying to said substrate an activated plasma formed by passing a composition comprising a rare gas into a chamber in a direction through an energy converter arranged in said chamber and capable of converting electromagnetic waves to electric energy and discharging said electric energy to a load arranged in said chamber and capable of forming an electric or magnetic field; the composition comprising the rare gas being passed to the same side of the converter to which the electromagnetic waves are irradiated; irradiating the energy converter with electromagnetic waves to generate a plasma; applying an electric or magnetic field to said generated plasma; and applying the plasma to the substrate; wherein said energy converter comprises a material selected from the group consisting of
(1) a carbonaceous material selected from the group consisting of amorphous carbon, graphite and activated carbon and
(2) a perovskite oxide complex of the formula $ABO_3$ wherein A is $Na^+$, $K^+$, $Sr^{2+}$, $La^{3+}$, and $La^{3+}$ a part of which is substituted by $Sr^{2+}$, and B is selected from the group consisting of $Nb^{5+}$, $Ti^{4+}$, $Mn^{3+}$, $Cr^{3+}$, $Ni^{3+}$ and $Co^{3+}$.

14. A method according to claim 13, wherein a surface of said carbonaceous material is covered with a high melting point material selected from the group consisting of iron, nickel, chrome, tungsten, stainless steel alloy and titanium nitride.

15. A method according to claim 13, wherein said perovskite oxide complex is selected from the group consisting of $LaMnO_3$, $LaCrO_3$, $LaNiO_3$, $LaCoO_3$, $La_{0.8}Sr_{0.2}CoO_3$, $KNbO_3$, $La_{0.5}Sr_{0.5}CoO_3$, $SrTiO_3$, $La_{0.6}Sr_{0.4}CoO_3$, and $NaNbO_3$.

16. A method according to claim 15, wherein said perovskite oxide complex is selected from the group consisting of $La_{0.8}Sr_{0.2}CoO_3$, $La_{0.6}Sr_{0.4}CoO_3$ and $La_{0.5}Sr_{0.5}CoO_3$.

17. An apparatus for generating a plasma comprising:
a chamber under atmospheric pressure; an electromagnetic wave generator arranged to irradiate an energy converter arranged in said chamber; a gas inlet arranged to introduce gas into said chamber; the gas inlet and the electromagnetic wave generator being located on the same side of the converter, whereby a composition comprising a rare gas can pass through the converter per se and/or a support therefor; and a gas outlet located at the side opposite to the gas inlet and the electromagnetic wave generator with respect to the converter; and wherein said energy converter arranged in said chamber is capable of converting electromagnetic waves to electric energy and discharging said electric energy, and comprises a material selected from the group consisting of:
  (1) a carbonaceous material selected from the group consisting of amorphous carbon, graphite and activated carbon and
  (2) a perovskite oxide complex of the formula $ABO_3$ wherein A is selected from the group consisting of $Na^+$, $K^+$, $Sr^{2+}$, $La^{3+}$, and $La^{3+}$ a part of which is substituted by $Sr^{2+}$ and B is selected from the group consisting of $Nb^{5+}$, $Ti^{4+}$, $Mn^{3+}$, $Cr^{3+}$, $Ni^{3+}$ and $Co^{3+}$.

18. An apparatus according to claims 17, wherein a surface of said carbonaceous material is covered with a high melting point material selected from the group consisting of iron, nickel, chrome, tungsten, stainless steel alloy and titanium nitride.

19. An apparatus according to claim 17, wherein said perovskite oxide complex is selected from the group consisting of $LaMnO_3$, $LaCrO_3$, $LaNi_3$, $LaCoO_3$, $La_{0.8}Sr_{0.2}CoO_3$, $KNbO_3$, $La_{0.5}Sr_{0.5}CoO_3$, $SrTiO_3$, $La_{0.6}Sr_{0.4}CoO_3$, and $NaNbO_3$.

20. An apparatus according to claim 19, wherein said perovskite oxide complex is selected from the group consisting of $La_{0.8}Sr_{0.2}CoO_3$, $La_{0.6}Sr_{0.4}CoO_3$, and $La_{0.5}Sr_{0.5}CoO_3$.

21. An apparatus for treating a substrate by a plasma, comprising: a chamber under atmospheric pressure; an electromagnetic wave generator arranged to irradiate an energy converter arranged in said chamber; a gas inlet arranged to introduce gas into said chamber; the gas inlet and the electromagnetic wave generator being located on the same side of the converter whereby a composition comprising a rare gas can pass through the converter per se and/or a support therefore and a gas inlet and the electromagnetic wave generator with respect to the converter; and wherein the energy converter arranged in said chamber is capable of converting electromagnetic waves to electric energy and discharging said electric energy, and comprises a material selected from the group consisting of:
  (1) a carbonaceous material selected from the group consisting of amorphous carbon, graphite and activated carbon and
  (2) a perovskite oxide complex of the formula $ABO_3$ wherein A is selected from the group consisting of $Na^+$, $K^+$, $Sr^{2+}$, $La^{3+}$, and $La^{3+}$ a part of which is substituted by $Sr^{2+}$, and B is selected from the group consisting of $Nb^{5+}$, $Ti^{4+}$, $Mn^{3+}$, $Cr^{3+}$, $Ni^{3+}$ and $Co^{3+}$.

22. An apparatus according to claim 21, wherein a surface of said carbonaceous material is covered with a high melting point material selected from the group consisting of iron, nickel, chrome, tungsten stainless steel alloy and titanium nitride.

23. An apparatus according to claim 21, wherein said perovskite oxide complex is selected from the group consisting of $LaMnO_3$, $LaCrO_3$, $LaNiO_3$, $LaCoO_3$, $La_{0.8}Sr_{0.2}CoO_3$, $KNbO_3$, $La_{0.5}Sr_{0.5}CoO_3$, $SrTiO_3$, $La_{0.6}Sr_{0.4}CoO_3$, and $NaNbO_3$.

24. An apparatus according to claim 23, wherein said perovskite oxide complex is $La_{0.8}Sr_{0.2}CoO_3$, $La_{0.6}Sr_{0.4}CoO_3$, and $La_{0.5}Sr_{0.5}CoO_3$.

25. An apparatus for activating a plasma comprising:
a chamber under atmospheric pressure; an electromagnetic wave generator arranged to irradiate an energy converter arranged in said chamber; a gas inlet arranged to introduce gas into said chamber; the gas inlet and the electromagnetic wave generator being located on the same side of the converter whereby a composition comprising a rare gas can pass through the converter per se and/or a support therefor; a gas outlet located at the side opposite to the gas inlet and the electromagnetic wave generator with respect to the converter, and the energy converter arranged in said chamber and capable of converting electromagnetic waves to electric energy and discharging said electric energy; and a load arranged in said chamber downstream of said energy converter in a path of the gas introduced through said gas inlet and capable of forming an electric or magnetic field; wherein said energy converter comprises a material selected from the group consisting of
  (1) a carbonaceous material selected from the group consisting of amorphous carbon, graphite and activated carbon and
  (2) a perovskite oxide complex of the formula $ABO_3$ wherein A is selected from the group consisting of $Na^+$, $K^+$, $Sr^{2+}$, $La^{3+}$, and $La^{3+}$ a part of which is substituted by $Sr^{3+}$, and B is selected from the group consisting of $Nb^{5+}$, $Ti^{4+}$, $Mn^{3+}$, $Cr^{3+}$, $Ni^{3+}$ and $Co^{3+}$.

26. An apparatus according to claim 25, wherein a surface of said carbonaceous material is covered with a high melting point material selected from the group consisting of iron, nickel, chrome, tungsten, stainless steel alloy and titanium nitride.

27. An apparatus according to claim 25, wherein said perovskite oxide complex is selected from the group consisting of $LaMnO_3$, $LaCrO_3$, $LaNiO_3$, $LaCoO_3$, $La_{0.8}Sr_{0.2}CoO_3$, $KNbO_3$, $La_{0.5}Sr_{0.5}CoO_3$, $SrTiO_3$, $La_{0.6}Sr_{0.4}CoO_3$, and $NaNbO_3$.

28. An apparatus according to claim 27, wherein said perovskite oxide complex is selected from the group consisting of $La_{0.8}Sr_{0.2}CoO_3$, $La_{0.6}Sr_{0.4}CoO_3$, and $La_{0.5}Sr_{0.5}CoO_3$.

29. An apparatus for treating a substrate with a plasma comprising:
a chamber under atmospheric pressure; an electromagnetic wave generator arranged to irradiate an energy converter arranged in said chamber; a gas inlet arranged to introduce gas into said chamber upstream of the energy converter; the gas inlet and the electromagnetic wave generator being located on the same side of the converter whereby a composition comprising a rare gas can pass through the converter per se and/or a support therefor; gas outlet located at the side opposite to the gas inlet and the electromagnetic wave generator with respect to the converter; the energy converter being capable of converting electromagnetic waves to electric energy and discharging said electric energy; and a load capable of forming an electric or magnetic field in said chamber at a point downstream of said energy converter in a path of a gas introduced through said gas inlet; wherein said energy converter comprises a material selected from the group consisting of (1) a carbonaceous material selected from the group consisting of amorphous carbon, graphite and activated carbon and (2) a perovskite oxide complex of the formula $ABO_3$ wherein A is selected from the group consisting of $Na^+$, $K^+$, $Sr^{2+}$, $La^{3+}$, and $La^{3+}$ a part of which is substituted by $Sr^{2+}$, and B is selected from the group consisting of $Nb^{5+}$, $Ti^{4+}$, $Mn^{3+}$, $Cr^{3+}$, $Ni^{3+}$ and $Co^{3+}$.

30. An apparatus according to claim 29, wherein a surface of said carbonaceous material is covered with a high melting point material selected from the group consisting of iron, nickel, chrome, tungsten, stainless steel alloy and titanium nitride.

31. An apparatus according to claim 29, wherein said perovskite oxide complex is selected from the group consisting of $LaMnO_3$, $LaCro_3$, $LaNiO_3$, $LaCoO_3$, $La_{0.8}Sr_{0.2}CoO_3$, $KNbO_3$, $La_{0.5}Sr_{0.5}CoO_3$, $SrTiO_3$, $La_{0.6}Sr_{0.4}CoO_3$, and $NaNbO_3$.

32. An apparatus according to claim 31, wherein said perovskite oxide complex is selected from the group consisting of $La_{0.8}Sr_{0.2}CoO_3$, $La_{0.6}Sr_{0.4}CoO_3$, and $La_{0.5}Sr_{0.5}CoO_3$.

* * * * *

UNITED STATES PATENT AND TRADEMARK OFFICE
CERTIFICATE OF CORRECTION

PATENT NO. : 5,628,883
DATED : May 13, 1997
INVENTOR(S) : Sugiyama, et al

It is certified that error appears in the above-indentified patent and that said Letters Patent is hereby corrected as shown below:

Column 14, line 17; "K" should read --$K^+$--

Column 15, line 34; "$LaNi_3$," should read --$LaNiO_3$-- line 49; "therefore" should read --therefor--

Column 16, line 35; "$Sr^{3+}$" should read --$Sr^{2+}$--

Column 18, line 6; "$LaCro_3$" should read --$LaCrO_3$--

Signed and Sealed this

Twenty-first Day of October 1997

*Attest:*

BRUCE LEHMAN

*Attesting Officer*    *Commissioner of Patents and Trademarks*